United States Patent [19]

Tsutsui

[11] Patent Number: 5,157,632
[45] Date of Patent: Oct. 20, 1992

[54] HIGH-SPEED LOW-POWER CONSUMPTION SENSE AMPLIFIER CIRCUIT INCORPORATED IN SEMICONDUCTOR MEMORY DEVICE

[75] Inventor: Hiroaki Tsutsui, Tokyo, Japan
[73] Assignee: NEC Corporation, Tokyo, Japan
[21] Appl. No.: 604,301
[22] Filed: Oct. 29, 1990

[30] Foreign Application Priority Data

Oct. 27, 1989 [JP] Japan .................. 1-280240

[51] Int. Cl.⁵ .................................. G11C 11/40
[52] U.S. Cl. ........................... 365/208; 365/233.5
[58] Field of Search ............ 365/207, 208, 205, 233.5; 307/530

[56] References Cited

U.S. PATENT DOCUMENTS 4,592,026  5/1986  Matsukawa et al. ............ 365/233.5
4,947,379  8/1990  Okuyama ........................ 365/233.5

Primary Examiner—Joseph A. Popek
Attorney, Agent, or Firm—Sughrue, Mion, Zinn, Macpeak & Seas

[57] ABSTRACT

A sense amplifier circuit is provided in association with a column of memory cells through first and second bit lines for increasing a small difference in voltage level between the first and second bit lines and comprises first and second series combinations of field effect transistors coupled in parallel between a power voltage level and a discharging transistor, in which an auxiliary current path is established in parallel to a main current path produced in the second series combination while the small difference is increased, thereby accelerating the increasing operation of the small difference without any sacrifice of current consumption in the idling stage.

6 Claims, 4 Drawing Sheets

HIGH-SPEED LOW-POWER CONSUMPTION SENSE AMPLIFIER CIRCUIT INCORPORATED IN SEMICONDUCTOR MEMORY DEVICE

FIELD OF THE INVENTION

This invention relates to a semiconductor memory device and, more particularly, to a high-speed and low-power consumption sense amplifier circuit incorporated in the semiconductor memory device.

DESCRIPTION OF THE RELATED ART

A typical example of a sense amplifier circuit is illustrated in FIG. 1 of the drawings and designated by reference numeral 1. The sense amplifier circuit 1 is associated with a memory cell array 2 having a plurality of memory cells in matrix, and a row address decoder circuit 3 shifts one of the word lines W1 to Wn to an active level on the basis of row address bits A1, A2, ... and An. One of the word lines W1 to Wn activates a row of the memory cells, and a column selector unit (not shown) allows a data bit read out from one of the activated memory cells to take place on a bit line pair D and $\overline{D}$ in the form of a small difference in voltage in response to a selecting signal fed from a row address decoder circuit (not shown) produced on the basis of column address bits. The bit line pair D and $\overline{D}$ propagates the data bit to the sense amplifier circuit 1.

The sense amplifier circuit is implemented by two CMOS inverter circuits accompanied with a discharging transistor QN1 of an n-channel type, and each of the CMOS inverter circuits is a series combination of a p-channel type field effect transistor QP2 or QP3 and an n-channel type field effect transistor QN4 or QN5. The bit lines D and $\overline{D}$ are coupled to the gate electrodes of the n-channel type field effect transistors QN4 and QN5, respectively, and the common drain node between the transistors QP2 and QN4 is coupled to the gate electrodes of the p-channel type field effect transistors QP2 and QP3. The sense amplifier circuit 1 thus arranged quickly increases the small difference in voltage level, and an output data bit Dout is fed from the common drain node of the transistors QP3 and QN5 to an output circuit (not shown).

The bit line $\overline{D}$ is coupled to through the column selector circuit to a dummy memory cell provided in association with the memory cell array 2, and the small difference between the bit lines D and $\overline{D}$ ranges between +dV and -dV depending upon the data bit read out from one of the memory cells. If the small difference ($V_D - V_{\overline{D}}$) between the bit lines D and $\overline{D}$ changes from -dV to +dV and vice versa, the voltage level of the output data bit Dout traces plots A in FIG. 2 and is changed between the ground voltage level and a power voltage level Vdd.

A parasitic capacitance CL is assumed to couple to the output node Dout, and the transistors QP3 and QN5 are expected to supply and discharge electric charges Qe. The amount of electric charges Qe is given as $$Qe = Vdd \times CL$$

A time delay tpd takes place from an appearance of a data bit between the bit line pair D and $\overline{D}$ to the production of the output data bit Dout, and the current driving capabilities of the transistors QP3 and QN5 deeply concern the time delay tpd. Since the current driving capability of a field effect transistor is dominated by the gate size or the gate width of the field effect transistor, the time delay tpd is in inverse proportion to the gate size of a field effect transistor. Namely, if the effective gate width of the field effect transistors QP3 and QN5 are increased, the time delay tpd is decreased, but a narrow effective gate width results in a large amount of time delay tpd. Thus, a wide gate electrode is effective against the time delay tpd. However, if the gate electrodes are widened, the current consumption is increased; however, a narrow gate electrode and, accordingly, a narrow channel result in a small amount of current consumption. In other words, there is a trade-off between the amount of the time delay tpd and the current consumption.

SUMMARY OF THE INVENTION

It is therefore an important object of the present invention to provide a sense amplifier circuit which decreases the time delay without any increase of the current consumption.

To accomplish the object, the present invention proposes to provide an auxiliary current path while a small difference in voltage level is increased.

In accordance with the present invention, there is provided a sense amplifier circuit provided in association with a column of memory cells through first and second bit lines and operative to increase a small difference in voltage level between the first and second bit lines, the small difference taking place after one of the memory cells is selected, comprising: a) a first series combination coupled between a first voltage source and a common node and having a first transistor of a first channel conductivity type and a second transistor of a second channel conductivity type opposite to the first channel conductivity type; b) a second series combination coupled between the first voltage source and the common node and having a third transistor of the first channel conductivity type and a fourth transistor of the second channel conductivity type, gate electrodes of the first and third transistors being coupled to a common drain node of the first and second transistors, gate electrodes of the second and fourth transistors being respectively coupled to the first bit line and the second bit line, the second series combination providing a main current path between the first voltage source and the common node after the small difference in voltage level takes place; c) a discharging transistor coupled between the common node and a second voltage source different in voltage level from the first voltage source; d) an output node coupled to a common drain node of the third and fourth transistors and supplied with an output data bit produced through an increase of the small difference; and e) an auxiliary current path provided in parallel to the main current path and established after aforesaid one of the memory cells is selected, the auxiliary current path being closed after the increase of the small difference.

BRIEF DESCRIPTION OF THE DRAWINGS

The features and advantages of a sense amplifier circuit according to the present invention will be more clearly understood from the following description taken in conjunction with the accompanying drawings in which.

DESCRIPTION OF THE PREFERRED EMBODIMENTS

First Embodiment

Figure 3:
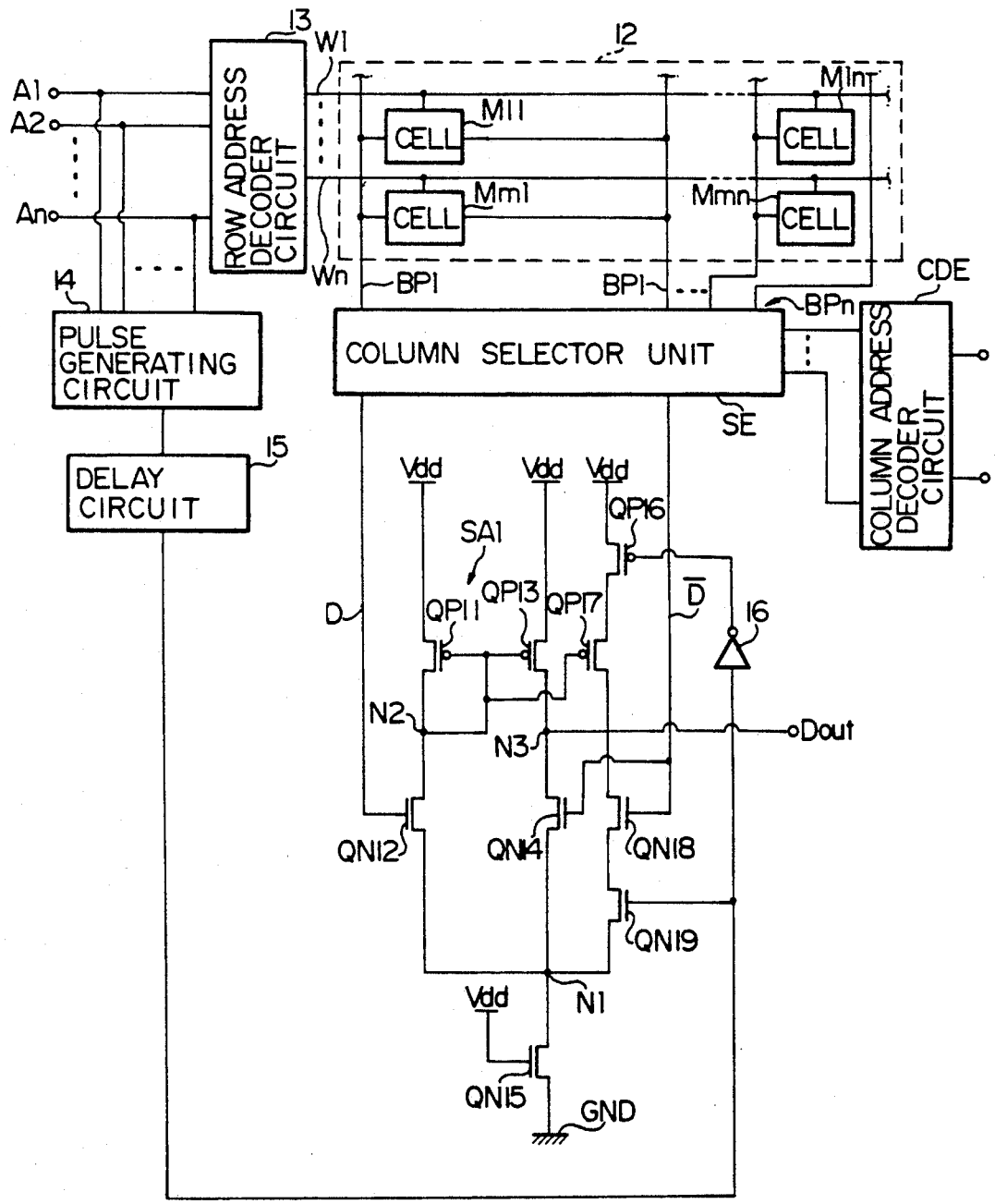
FIG. 3 is a circuit diagram showing the arrangement of a sense amplifier circuit according to the present invention.

Referring first to FIG. 3, a sense amplifier circuit SA1 embodying the present invention is provided in association with a memory cell array 12 incorporated in a semiconductor memory device. The memory cell array 12 has a plurality of memory cells M11, M1n, Mm1 and Mmn which are arranged in rows and columns. Although more than four memory cells are incorporated in the memory cell array 12, only four memory cells M11 to Mmn are shown in the figure for the sake of simplicity. The rows of the memory cells M11 to Mmn are respectively coupled to word lines W1 to Wn, and a row address decoder circuit 13 shifts one of the word lines W1 to Wn to an active level on the basis of the row address bits A1, A2, ... and An. Bit line pairs BP1 to BPn are respectively provided for the columns of the memory cells M11 to Mmn, and one of the bit line pairs BP1 to BPn is coupled through a column selector unit SE to bit lines D and $\bar{D}$ depending upon a selecting signal fed from a column address decoder circuit CDE. A dummy memory cell (not shown) is provided in association with each column of the memory cells M11 to Mmn, and the sense amplifier circuit SA1 is coupled through bit lines D and $\bar{D}$ and one of the bit line pairs BP1 to BPn to one of the memory cells M11 to Mmn and the associated dummy memory cell. The bit line D is varied in voltage level or substantially keeps the voltage level depending upon the logic level of a data bit read out from one of the memory cells M11 to Mmn, but the dummy memory cell decays the voltage level on the bit line $\bar{D}$ at a lower speed than the bit line D. Then, a small difference in voltage level takes place between the bit lines D and $\bar{D}$, and the small difference is either $-dV$ or $+dV$.

The sense amplifier circuit SA1 comprises a first series combination of a first p-channel type field effect transistor QP11 and a second n-channel type field effect transistor QN12 coupled between a source of power voltage level Vdd and a common node N1, a second series combination of a third p-channel type field effect transistor QP13 and a fourth n-channel type field effect transistor QN14 coupled in parallel to the first series combination, and a discharging transistor QN15 coupled between the common node N1 and a source of a ground voltage level GND. The gate electrodes of the p-channel type field effect transistors QP11 and QP13 are coupled to a common drain node N2 of the first series combination, and the gate electrodes of the n-channel type field effect transistors QN12 and QN14 are respectively coupled to the bit lines D and $\bar{D}$. A common drain node N3 of the second series combination is coupled to an output node Dout, and an output data bit of the sense amplifier circuit SA1 is provided at the output node Dout. Between the source of power voltage level Vdd and the common node N1 is further coupled a first activation transistor QP16 of the p-channel type, a third series combination of a p-channel type field effect transistor QP17 and an n-channel type field effect transistor QN18 and a second activation transistor of the n-channel type QN19 in series. The gate electrode of the p-channel type field effect transistor QP17 is coupled to the common drain node N12, and the gate electrode of the n-channel type field effect transistor QN18 is coupled to the bit line $\bar{D}$. In this instance, the second series combination provides a main current path, and the third series combination provides an auxiliary current path.

A controlling circuit is provided in association with the sense amplifier circuits SA1 and comprises a pulse generating circuit 14, a delay circuit 15 and an inverter circuit 16. The pulse generating circuit 14 is supplied with the row address bits A1 to An and operative to detect an alternation in logic level of any one of the row address bits A1 to An. When one of the row address bits A1 to An is altered in logic level, the pulse generating circuit 14 produces a one-shot pulse of a positive high voltage level and continues it for a predetermined time period. The one-shot pulse is supplied to the delay circuit 15, and the delay circuit 15 produces a delayed one-shot pulse. The delayed one-shot pulse is directly supplied to the gate electrode of the second activation transistor QN19, and the inverter circuit 16 produces a complementary signal of the delayed one-shot pulse. The complementary signal of the delayed one-shot pulse is supplied to the gate electrode of the first activation transistor QP16. With the delayed one-shot pulse and the complementary signal thereof, the first and second activation transistors QP16 and QN19 concurrently turn on and off so that the third series combination is electrically coupled to and blocked from the voltage sources Vdd and GND.

Other peripheral circuits are incorporated in the semiconductor memory device, but they are not shown in the drawings, because they are not directly related to the gist of the present invention.

Figure 4:
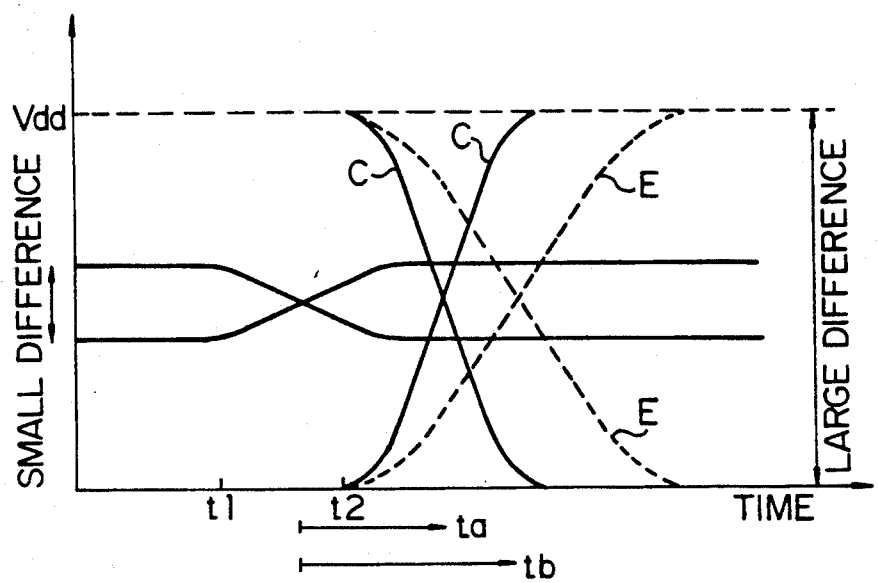
FIG. 4 is a diagram showing waveforms of voltage levels produced in the sense amplifier circuits shown in FIGS. 1 and 3.

Description is made on the circuit behavior of the sense amplifier circuit SA1 with reference to FIG. 4. While no alternation in logic level takes place in the row address bits A1 to An, the one-shot pulse and, accordingly, the delayed one-shot pulse are not produced by the pulse generating circuit 14 and the delay circuit 15, and the first and second activation transistors QP16 and QN19 are turned off. A small amount of current merely flows through the second series combination, and, for this reason, the power consumption is relatively small.

If the row address bits A1 to An are altered and the row and column address bits designate other of the memory cells M11 to Mm1, a data bit is read out from the other of the memory cells M11 to Mm1, and, accordingly, the small difference begins to change at time t1. The pulse generating circuit 14 detects the alternation and produces the one-shot pulse. The one-shot pulse is delayed by the delay circuit 15, and the one-shot pulse and the delayed one-shot pulse are respectively supplied to the second and first activation transistors QN19 and QP16. Then, the first and second activation transistors QP16 and QN19 concurrently turn on so that the third series combination is activated with the positive voltage level Vdd and the ground voltage level GND. When the third series combination is activated, the auxiliary current path can be established in the third series combination. Thus, the auxiliary current path is established after the selection of the other of the memory cells M11 to Mm1.

Figure 1:
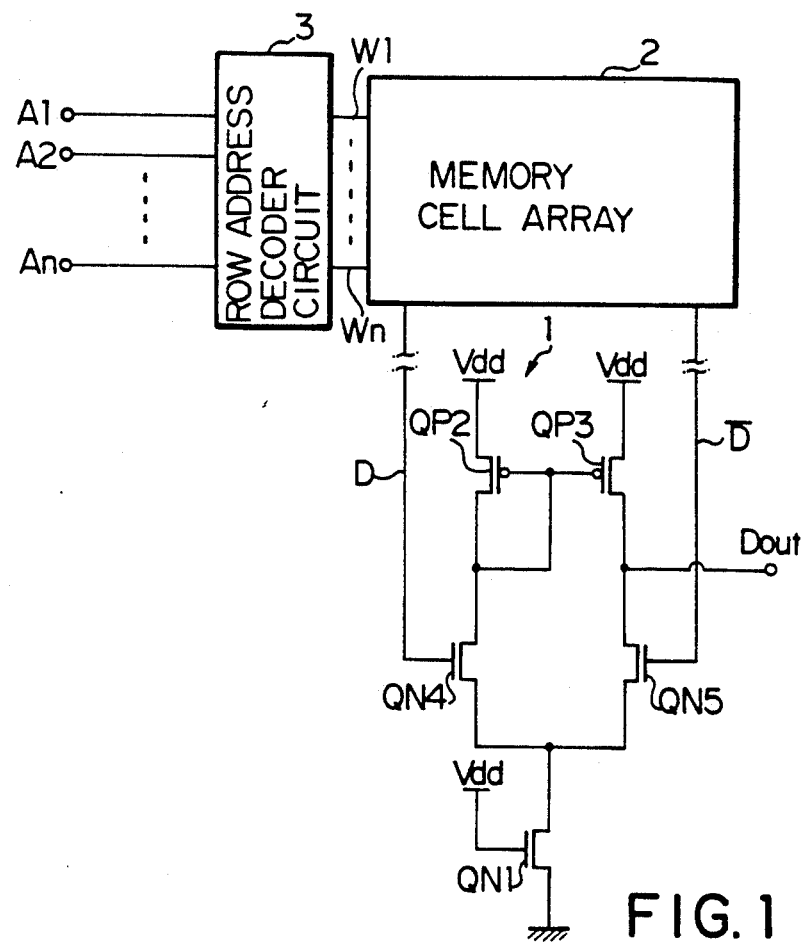
FIG. 1 is a circuit diagram showing the arrangement of a prior art sense amplifier circuit.
Figure 2:
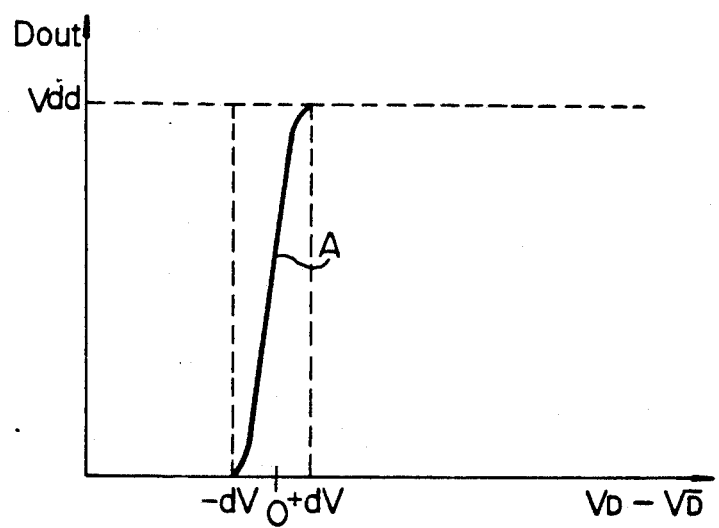
FIG. 2 is a graph showing input voltage to output voltage characteristics of the prior art sense amplifier circuit.
Figure 5:
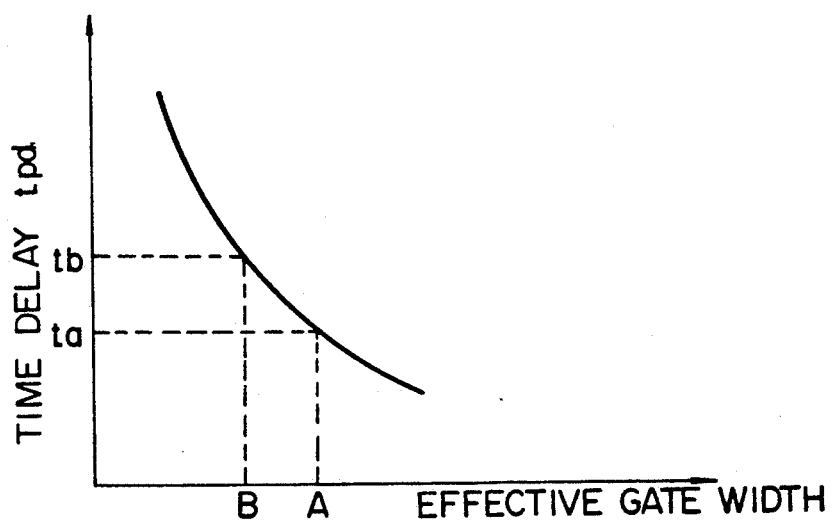
FIG. 5 is a graph showing the time delay in terms of the effective gate width providing a current path in the sense amplifier circuit.

While the activation transistors QP16 and QN19 are turned off, only the main current path in the second series combination is available, and, for this reason, an effective gate width is formed by the gate width B of the field effect transistors of the second series combination. However, when the auxiliary current path is established, the effective gate width is increased from B to A as shown in FIG. 5, and the time delay tpd is decreased from tb to ta. The time delay ta and tb are measured between the crossing point of the small difference and the crossing point of the large difference. This means that the sense amplifier circuit SA1 is accelerated with the auxiliary current path. The small difference is assumed to reach a sensible level at time t2, and the sense amplifier circuit SA1 increases the small difference in voltage level at an improved speed, because the auxiliary current path has been already established. Real lines C indicate the voltage levels at the output node Dout of the sense amplifier circuit SA1, and broken lines E stand for the output node Dout of the prior art sense amplifier circuit 1. Comparing the real lines C with the broken lines E, it is understood that the auxiliary current path surely improves the operational speed of the sense amplifier circuit SA1. After increasing the small difference, the predetermined time period is expired, and the one-shot pulse and, accordingly, the delayed one-shot pulse are recovered to the inactive low level. Then, the first and second activation transistors QP16 and QN19 turn off, and no current flows through the auxiliary current path. This results in that the power consumption is decreased again. Although the power consumption is increased in the sensing operation, the total amount of the power consumption throughout the operation is not so much in comparison with the prior art sense amplifier circuit 1 described with reference to FIG. 1 of the drawings.

Second Embodiment

Figure 6:
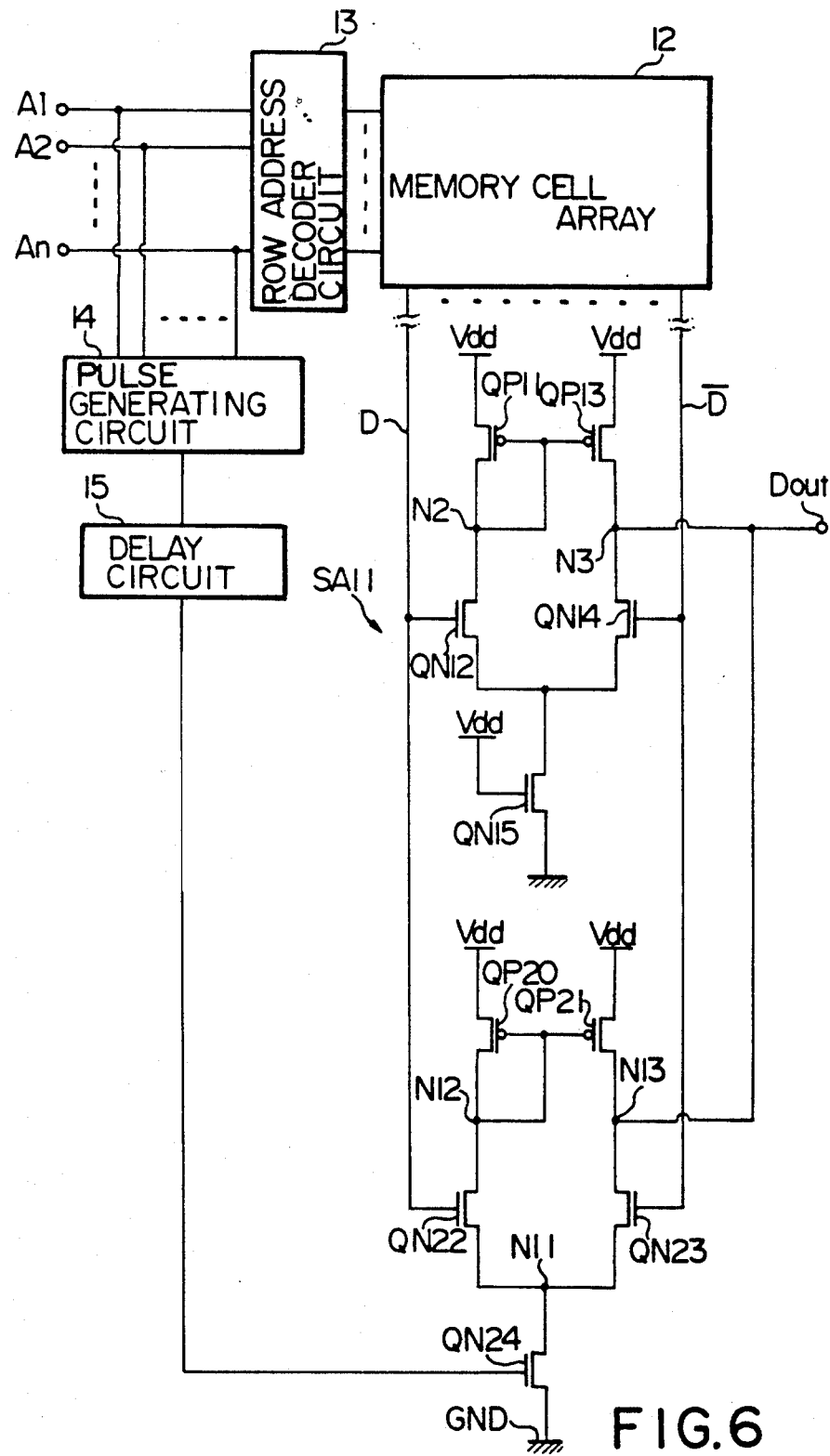
FIG. 6 is a circuit diagram showing the arrangement of another sense amplifier circuit according to the present invention.

Turning to FIG. 6 of the drawings, another sense amplifier circuit SA11 is illustrated, and corresponding circuits and transistors are designated by the same reference marks used in FIG. 3 without any description. The sense amplifier circuit SA11 has fourth and fifth series combinations of p-channel type field effect transistors QP20 and QP21 and n-channel type field effect transistors QN22 and QN23 accompanied with a discharging transistor QN24 of the n-channel type instead of the third series combination. The fourth and fifth series combinations are coupled in parallel between the source of power voltage level Vdd and a common node N11, and the discharging transistor QN24 is coupled between the common node N11 and the source of ground voltage level GND. The gate electrodes of the p-channel type field effect transistors QP20 and QP21 are coupled to the common drain node N12 of the transistors QP20 and QN22, and the common drain node of the transistors QP21 and QN23 is coupled to the output node Dout. The gate electrodes of the n-channel type field effect transistors QN22 and QN23 are respectively coupled to the bit lines D and $\bar{D}$, and the delayed one-shot pulse is supplied to the gate electrode of the discharging transistor QN24.

When the delayed one shot pulse allows the discharging transistor QN24 to turn on, the fourth and fifth series combinations behaves as similar to the first and second series combinations and cooperates therewith so that the output data bit Dout is quickly produced. In this instance, an auxiliary current path is established in the fifth series combination, and the auxiliary current path accelerates the sense amplifier circuit SA11 without any substantial deterioration of the power consumption.

Although particular embodiments of the present invention have been shown and described, it will be obvious to those skilled in the art that various changes and modifications may be made without departing from the spirit and scope of the present invention.

What is claimed is:

1. A sense amplifier circuit provided in association with a column of memory cells through first and second bit lines and operative to increase a small difference in voltage level between said first and second bit lines, said small difference taking place after one of said memory cells is selected, comprising:
   a) a first series combination coupled between a first voltage source and a common node and having a first transistor of a first channel conductivity type and a second transistor of a second channel conductivity type opposite to said first channel conductivity type;
   b) a second series combination coupled between said first voltage source and said common node and having a third transistor of said first channel conductivity type and a fourth transistor of said second channel conductivity type, gate electrodes of said first and third transistors being coupled to a common drain node of said first and second transistors, gate electrodes of said second and fourth transistors being respectively coupled to said first bit line and said second bit line, said second series combination providing a main current path between said first voltage source and said common node after said small difference in voltage level take place;
   c) a discharging transistor coupled between said common node and a second voltage source different in voltage level from said first voltage source;
   d) an output node coupled to a common drain node of said third and fourth transistors and supplied with an output data bit produced through an increase of said small difference; and
   e) an auxiliary current path provided in parallel to said main current path and established after said one of said memory cells is selected, said auxiliary current path having transistors which cut off said auxiliary current path after said increase of said small difference.

2. A sense amplifier circuit as set forth in claim 1, in which said auxiliary current path is produced in a third series combination of a fifth transistor of said first channel conductivity type and a sixth transistor of said second channel conductivity type coupled between a first activation transistor of said first channel conductivity type and a second activation transistor of said second channel conductivity type, said first and second activation transistors being coupled to said first and second voltage sources, respectively.

3. A sense amplifier circuit as set forth in claim 2, in which a controlling unit is provided in association with said first and second activation transistors and allows said first and second activation transistors to turn on after said one of said memory cells is selected.

4. A sense amplifier circuit as set forth in claim 3, in which said controlling unit comprises a one-shot pulse generating circuit operative to monitor an address designating one of said memory cells for producing a one-shot pulse when said address is changed, a delay circuit supplied with said one-shot pulse and producing a delayed pulse and, an inverter circuit supplied with said delayed pulse and producing a complementary signal of said delayed pulse signal, and in which said complementary signal and said delayed pulse signal are respectively supplied to gate electrodes of said first and second activation transistors.

5. A sense amplifier circuit as set forth in claim 1, in which said sense amplifier circuit further comprises a third series combination of a fifth transistor of said first channel conductivity type and sixth transistor of said second channel conductivity type coupled between said first voltage source and a second common node, a fourth series combination of a seventh transistor of said first channel conductivity type and an eight transistor of said second channel conductivity type coupled between said first voltage source and said second common node, and a second discharging transistor of said second channel conductivity type coupled between said second common node and said second voltage source, gate electrodes of said fifth and sixth transistors being coupled to a common drain node of said fifth and sixth transistors, gate electrodes of said seventh and eight transistors being respectively coupled to said first bit line and said second bit line, wherein said fourth series combination provides said auxiliary current path.

6. A sense amplifier circuit as set forth in claim 5, in which a controlling circuit is provided in association with said sense amplifier circuit and comprises a one-shot pulse generating circuit operative to monitor an address designating one of said memory cells for producing a one-shot pulse when said address is changed, and a delay circuit supplied with said one-shot pulse and producing a delayed pulse fed to a gate electrode of said second discharging transistor.

* * * * *